(12) United States Patent
Fujimura et al.

(10) Patent No.: US 7,759,026 B2
(45) Date of Patent: *Jul. 20, 2010

(54) METHOD AND SYSTEM FOR MANUFACTURING A RETICLE USING CHARACTER PROJECTION PARTICLE BEAM LITHOGRAPHY

(75) Inventors: Akira Fujimura, Saratoga, CA (US); Lance Glasser, Saratoga, CA (US); Takashi Mitsuhashi, Kanagawa (JP); Kazuyuki Hagiwara, Tokyo (JP)

(73) Assignee: D2S, Inc., San Jose, CA (US)

( * ) Notice: Subject to any disclaimer, the term of this patent is extended or adjusted under 35 U.S.C. 154(b) by 148 days.

This patent is subject to a terminal disclaimer.

(21) Appl. No.: 12/202,364

(22) Filed: Sep. 1, 2008

(65) Prior Publication Data

US 2010/0053579 A1 Mar. 4, 2010

(51) Int. Cl.
G03C 5/00 (2006.01)
G03F 9/00 (2006.01)
(52) U.S. Cl. .................. 430/5; 430/22; 430/30; 430/296; 430/312; 430/320; 430/321; 430/942
(58) Field of Classification Search .............. 430/5, 430/22, 30, 296, 312, 320, 321, 942
See application file for complete search history.

(56) References Cited

U.S. PATENT DOCUMENTS

| | | |
|---|---|---|
| 4,712,013 A | 12/1987 | Nishimura |
| 5,082,762 A | 1/1992 | Takahashi |
| 5,804,339 A | 9/1998 | Kim |
| 6,049,085 A | 4/2000 | Ema |
| 6,087,046 A | 7/2000 | Nakasuji |
| 6,291,119 B2 | 9/2001 | Choi et al. |
| 6,544,700 B2 | 4/2003 | Ogino |
| 6,610,989 B1 | 8/2003 | Takahashi |
| 6,982,135 B2 | 1/2006 | Chang et al. |
| 7,420,164 B2 | 9/2008 | Nakasuji et al. |
| 2005/0263715 A1 | 12/2005 | Nakasuji et al. |
| 2007/0196768 A1 | 8/2007 | Ogino |
| 2008/0116397 A1 | 5/2008 | Yoshida et al. |
| 2008/0116399 A1 | 5/2008 | Fujimura |
| 2008/0118852 A1 | 5/2008 | Mitsuhashi |
| 2008/0128637 A1 | 6/2008 | Yoshida |

FOREIGN PATENT DOCUMENTS

| | | |
|---|---|---|
| JP | 1992155337 | 5/1992 |
| JP | 2000-066366 A | 3/2000 |

OTHER PUBLICATIONS

Akio Yamada and Takayuki Yabe, "Variable cell projection as an advance in electron-beam cell projection system", J. Vac. Sci. Technol. B, vol. 22, No. 6, Nov./Dec. 2004, pp. 2917-2922.
Office action for U.S. Appl. No. 12/269,777, mailed Nov. 24, 2009.
Bloecker, M. et al., "Metrics to Assess Fracture Quality for Variable Shaped Beam Lithography", Proceedings of SPIE, vol. 6349 (2006), pp. 63490Z-1-63490Z-10, SPIE, P.O. Box 10, Bellingham, WA. 98227, U.S.A.
International Search Report and the Written Opinion of the International Searching Authority, Application No. PCT/US2009/053327, mailed Mar. 2, 2010.

*Primary Examiner*—Christopher G Young
(74) *Attorney, Agent, or Firm*—The Mueller Law Office, P.C.

(57) ABSTRACT

A method for manufacturing a surface, the surface having a multiplicity of slightly different patterns, is disclosed with the method comprising the steps of designing a stencil mask having a set of characters for forming the patterns on the surface and reducing shot count or total write time by use of a character varying technique. A system for manufacturing a surface is also disclosed.

16 Claims, 17 Drawing Sheets

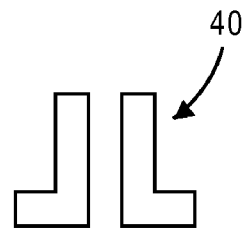
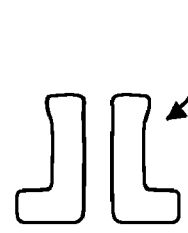
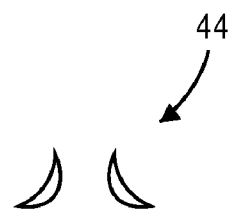
FIG. 2A     FIG. 2B     FIG. 2C
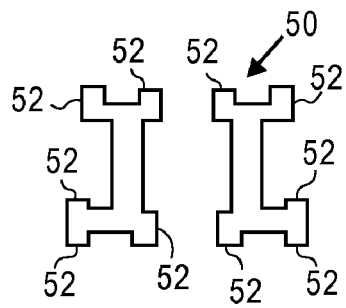
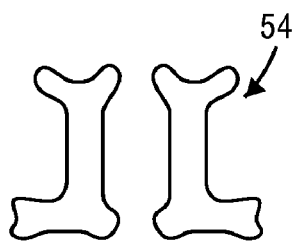
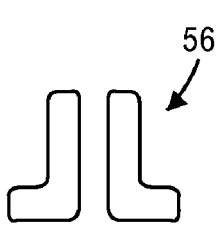
FIG. 3A     FIG. 3B     FIG. 3C
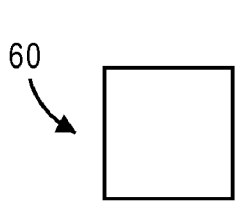
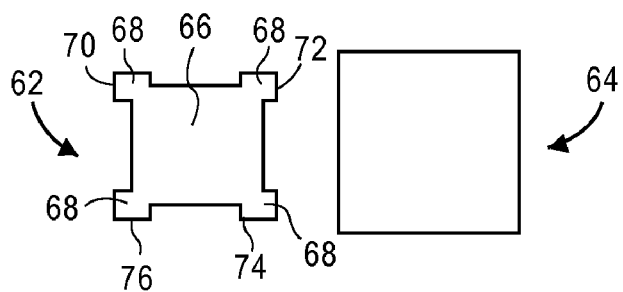
FIG. 4A     FIG. 4B
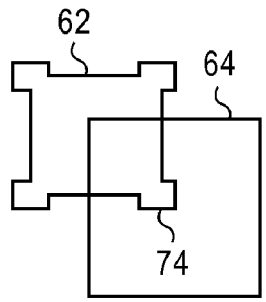
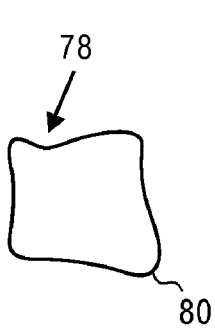
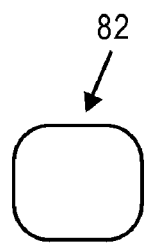
FIG. 4C     FIG. 4D     FIG. 4E

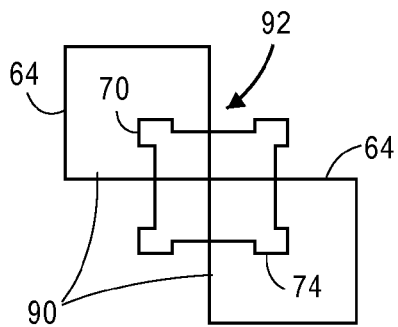 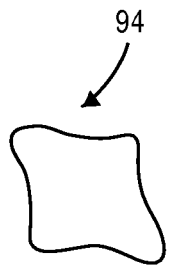 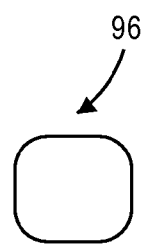
FIG. 5A  FIG. 5B  FIG. 5C
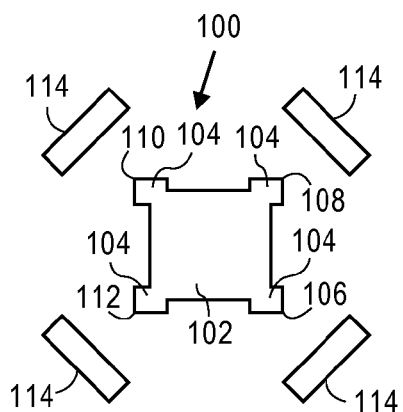 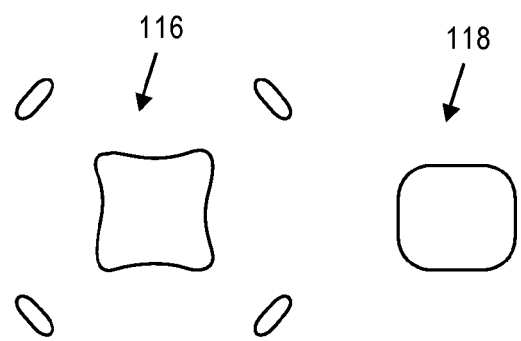
FIG. 6A  FIG. 6B  FIG. 6C

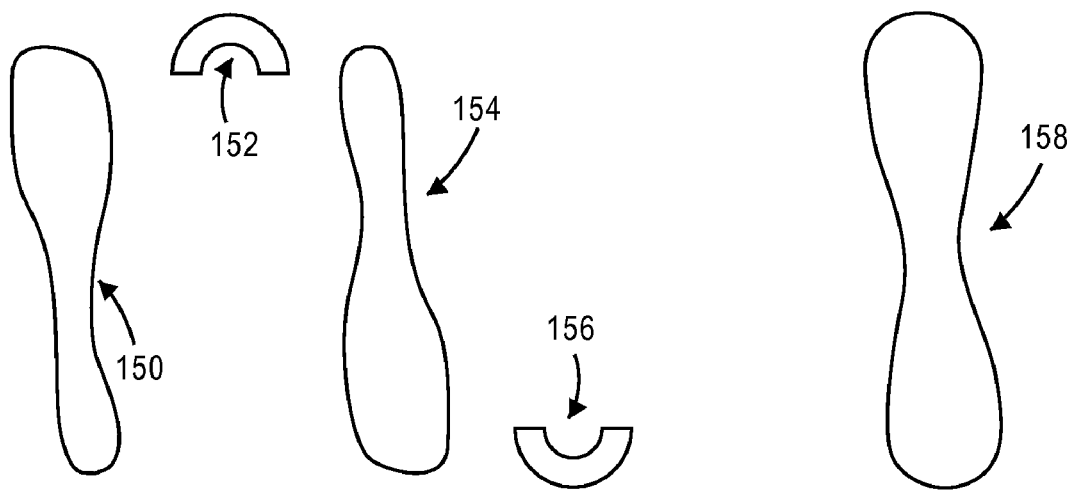
FIG. 7A  FIG. 7B

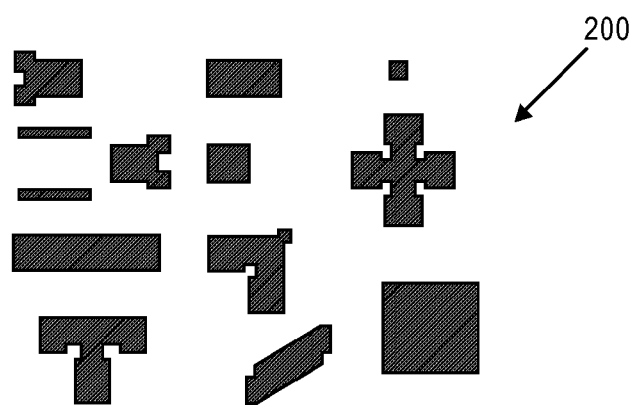
FIG. 8A
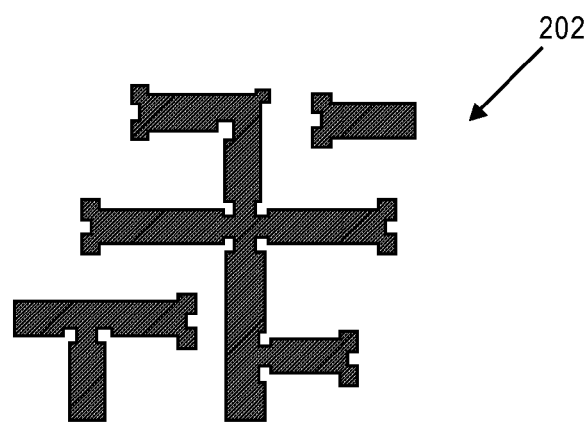
FIG. 8B
FIG. 8C

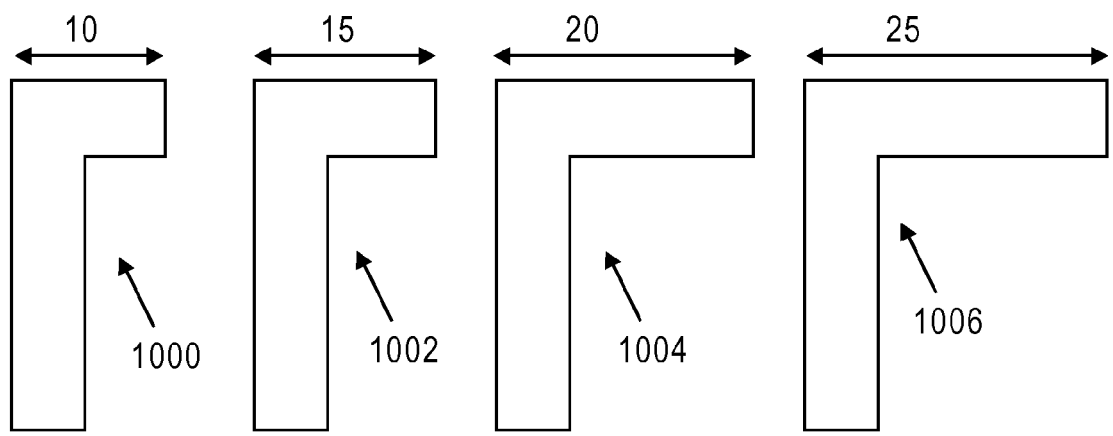
FIG. 19
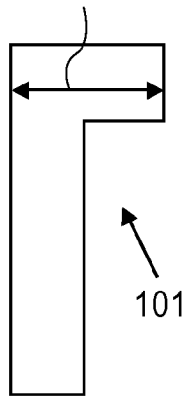 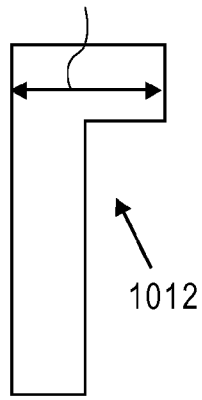
FIG. 20

METHOD AND SYSTEM FOR MANUFACTURING A RETICLE USING CHARACTER PROJECTION PARTICLE BEAM LITHOGRAPHY

RELATED APPLICATIONS

This application: 1) is related to Fujimura, U.S. patent application Ser. No. 12/202,365, entitled "Method For Optical Proximity Correction Of A Reticle To Be Manufactured Using Character Projection Lithography" filed on Sep. 1, 2008; and 2) is related to Fujimura, U.S. patent application Ser. No. 12/202,366, entitled "Method And System For Design Of A Reticle To Be Manufactured Using Character Projection Lithography" filed on Sep. 1, 2008.

BACKGROUND OF THE DISCLOSURE

The present disclosure is related to lithography, and more particularly to the design and manufacture of a surface which may be a reticle, a wafer, or any other surface, using character or cell projection lithography.

In the production or manufacturing of semiconductor devices, such as integrated circuits, optical lithography may be used to fabricate the semiconductor devices. Optical lithography is a printing process in which a lithographic mask or reticle is used to transfer patterns to a substrate such as a semiconductor or silicon wafer to create the integrated circuit. Other substrates could include flat panel displays or even photomasks. Also, extreme ultraviolet (EUV) or X-ray lithography are considered types of optical lithography. The reticle or multiple reticles may contain a circuit pattern corresponding to an individual layer of the integrated circuit and this pattern can be imaged onto a certain area on the substrate that has been coated with a layer of radiation-sensitive material known as photoresist or resist. Once the patterned layer is transferred the layer may undergo various other processes such as etching, ion-implantation (doping), metallization, oxidation, and polishing. These processes are employed to finish an individual layer in the substrate. If several layers are required, then the whole process or variations thereof will be repeated for each new layer. Eventually, a combination of multiples of devices or integrated circuits will be present on the substrate. These integrated circuits may then be separated from one another by dicing or sawing and then may be mounted into individual packages. In the more general case, the patterns on the substrate may be used to define artifacts such as display pixels or magnetic recording heads.

In the production or manufacturing of semiconductor devices, such as integrated circuits, maskless direct write may also be used to fabricate the semiconductor devices. Maskless direct write is a printing process in which patterns are transferred to a substrate such as a semiconductor or silicon wafer to create the integrated circuit. Other substrates could include flat panel displays, imprint masks for nano-imprinting, or even photomask. Desired patterns of a layer are written directly on the surface, which in this case is also the substrate. Once the patterned layer is transferred the layer may undergo various other processes such as etching, ion-implantation (doping), metallization, oxidation, and polishing. These processes are employed to finish an individual layer in the substrate. If several layers are required, then the whole process or variations thereof will be repeated for each new layer. Some of the layers may be written using optical lithography while others may be written using maskless direct write to fabricate the same substrate. Eventually, a combination of multiples of devices or integrated circuits will be present on the substrate. These integrated circuits are then separated from one another by dicing or sawing and then mounted into individual packages. In the more general case, the patterns on the surface may be used to define artifacts such as display pixels or magnetic recording heads.

As indicated, the lithographic mask or reticle comprises geometric patterns corresponding to the circuit components to be integrated onto a substrate. The patterns used to manufacture the reticle may be generated utilizing CAD (computer-aided design) software or programs. In designing the patterns the CAD program may follow a set of predetermined design rules in order to create the reticle. These rules are set by processing, design, and end-use limitations. An example of an end-use limitation is defining the geometry of a transistor in a way in which it cannot sufficiently operate at the required supply voltage. In particular, design rules can define the space tolerance between circuit devices or interconnect lines. The design rules are, for example, used to ensure that the circuit devices or lines do not interact with one another in an undesirable manner. For example, the design rules are used so that lines do not get too close to each other in a way that may cause a short circuit. The design rule limitations reflect, among other things, the smallest dimensions that can be reliably fabricated. When referring to these small dimensions, one usually introduces the concept of a critical dimension. These are, for instance, defined as the smallest width of a line or the smallest space between two lines, those dimensions requiring exquisite control.

One goal in integrated circuit fabrication by optical lithography is to reproduce the original circuit design on the substrate by use of the reticle. Integrated circuit fabricators are always attempting to use the semiconductor wafer real estate as efficiently as possible. Engineers keep shrinking the size of the circuits to allow the integrated circuits to contain more circuit elements and to use less power. As the size of an integrated circuit critical dimension is reduced and its circuit density increases, the critical dimensions of its corresponding mask pattern approaches the resolution limit of the optical exposure tool used in optical lithography. As the critical dimensions of the circuit layout become smaller and approach the resolution value of the exposure tool, the accurate transcription between the mask pattern and the actual circuit pattern developed on the resist layer becomes difficult. To further the use of optical lithography to transfer patterns having features that are smaller than the light wavelength used in the optical lithography process, a process known as optical proximity correction (OPC) has been developed. OPC alters the original layout on the mask to compensate for distortions caused by effects such as optical diffraction and the optical interaction of features with proximate features. OPC includes all resolution enhancement technologies performed with a reticle.

OPC adds sub-resolution lithographic features to mask patterns to reduce differences between the original mask pattern, that is, the design, and the final transferred circuit pattern on the substrate. The sub-lithographic features interact with the original mask pattern and with each other and compensate for proximity effects to improve the final transferred circuit pattern. One feature that is used to improve the transfer of the pattern is a sub-resolution assist feature (SRAF). Another feature that is added to improve pattern transference is referred to as "serifs". Serifs are small features that can be positioned on a corner of a pattern to sharpen the corner in the final transferred image. As the limits of optical lithography are being extended far into the sub-wavelength regime, the OPC features must be made more and more complex in order to compensate for even more subtle interactions and effects.

However, as imaging systems are pushed closer to their limits, the ability to produce reticles with sufficiently fine OPC features becomes critical. Although adding serifs or other OPC features to a mask pattern is advantageous, it also substantially increases the total features count in the mask pattern. For example, adding a serif to each of the corners of a square adds eight more rectangles to a mask or reticle pattern. Adding OPC features is a very laborious task and requires costly computation time that results in more expensive reticles. Not only are OPC patterns complex, but since optical proximity effects are long range compared to minimum line and space dimensions, the correct OPC patterns in a given location depend significantly on what other geometry is in the neighborhood. Thus, for instance, a line end will have different size serifs depending on what is near it on the reticle. This is even though the objective might be to produce exactly the same shape on the wafer. These slight but critical variations are important and have prevented others from being able to form reticle patterns. It is conventional to discuss the OPC-decorated patterns to be written on a reticle in terms of main features, that is features that reflect the design before OPC decoration, and OPC features, where OPC features might include serifs, jogs, and SRAF. To quantify what is meant by slight variations, a typical slight variation in OPC decoration from neighborhood to neighborhood might be 5% to 80% of a main feature size. Note that for clarity, variations in the design of the OPC are what is being referenced. Manufacturing variations, such as line-edge roughness and corner rounding, will also be present in the actual surface patterns. When these OPC variations produce substantially the same patterns on the wafer what is meant is that the geometry on the wafer is targeted to be the same within a specified error, which depends on the details of the function that that geometry is designed to perform, e.g., a transistor or a wire. Nevertheless, typical specifications are in the 2%-50% of a main feature range. There are numerous manufacturing factors that also cause variations, but the OPC component of that overall error is often in the range just listed.

There are a number of technologies used for forming patterns on a reticle, including using optical or particle beam systems. The most commonly used system is the variable shape beam (VSB) type, where a precise electron beam is shaped and steered onto a resist-coated surface of the reticle. These shapes are simple shapes, usually limited to rectangles of certain minimum and maximum sizes and triangles with their three internal angles being 45 degrees, 45 degrees, and 90 degrees of certain minimum and maximum sizes. At predetermined locations, doses of electrons are shot into the resist with these simple shapes. The total writing time for this type of system increases with the number of shots. A second type of system is a character projection system. In this case there is a stencil in the system that has in it a variety of shapes which may be rectilinear, arbitrary-angled linear, circular, annular, part circular, part annular, or arbitrary curvilinear shapes, and may be a connected set of complex shapes or a group of disjointed sets of a connected set of complex shapes. An electron beam can be shot through the stencil to efficiently produce more complex patterns (i.e., characters) on the reticle. In theory, such a system could be faster than a VSB system because it can shoot more complex shapes with each time-consuming shot. Thus, an E shot with a VSB system takes four shots, but could be done with one shot with a character projection system. Note that shaped beam systems can be thought of as a special (simple) case of character projection, where the characters are just simple characters, usually rectangles or 45-45-90 triangles. It is also possible to partially expose a character. This can be done by, for instance, blocking part of the particle beam. For example, the E described above can be partially exposed as an F or an I, where different parts of the beam are cut off by an aperture. For a very complex reticle, one must fracture the pattern into nearly billions and sometimes approaching trillions of elemental shapes. There are, for instance, simple rectangular shapes for a VSB system or a limited number of characters in a character projection system. The more total instances of elemental shapes (characters) in the pattern, the longer and more expensive the write time. However, for writing surfaces such as an OPC-decorated reticle where there are numerous fine variations among even the smaller patterns, such projection systems are today impractical. The number of characters that can be made available among which the selection of characters by the projection machine takes minimal time is limited, today only allowing about 10-1000 characters. When faced with the plethora of slightly varying OPC patterns that are required to be placed on a reticle, no system or method has been available which can accomplish this task.

Thus, it would be advantageous to reduce the time and expense it takes to prepare and manufacture a reticle that is used for a substrate. More generally, it would be advantageous to reduce the time and expense it takes to prepare and manufacture any surface. It would also be desirable to have a stencil mask that contains some of the complex characters needed to produce or generate a surface having various patterns that are required to be transferred to a surface. For example, it is possible that a surface can have thousands of patterns that have only slight differences among each other. In order to prepare a surface it is desirable to have a stencil mask that can generate many of these patterns having slight differences. As discussed more fully herein, this can be accomplished by using a stencil mask that contains a set of characters that can be combined, modified, or adjusted to generate the patterns with many of the slight variations. Thus, there exists a need for a method and a system for manufacturing a surface that eliminates the foregoing problems associated with preparing a surface.

SUMMARY OF THE DISCLOSURE

In one form of the present disclosure, a method for manufacturing a surface, the surface having a multiplicity of slightly different patterns is disclosed with the method comprising the steps of writing a surface with a set of characters for forming the patterns on the surface and reducing shot count or total write time by use of a character varying technique.

In another form of the present disclosure, a method for producing a surface is disclosed with the method comprising the steps of designing a number of patterns to be formed on a surface, the patterns being slightly different, determining a set of characters to be used from the number of patterns, preparing a stencil mask having the set of characters, and reducing shot count or total write time by use of a character varying technique.

In yet another form of the present disclosure, a system for manufacturing a surface, the surface having a multiplicity of slightly different patterns is disclosed with the system comprising a stencil mask having a set of characters for forming the patterns on the surface and a device for reducing shot count or total write time by use of a character varying technique.

These and other advantages of the present disclosure will become apparent after considering the following detailed specification in conjunction with the accompanying drawings.

BRIEF DESCRIPTION OF THE DRAWINGS

FIG. 2A illustrates a design of a pattern to be placed on a substrate;

FIG. 2B illustrates a pattern formed in a reticle from the design shown in FIG. 2A;

FIG. 2C illustrates a pattern formed in the photoresist of a substrate using the reticle of FIG. 2B, illustrating that without optical proximity correction, the image is not nearly similar to the design shown in FIG. 2A;

FIG. 3A illustrates an optical proximity corrected version of the pattern shown in FIG. 2A;

FIG. 3B illustrates an optical proximity corrected version of the pattern shown in FIG. 3A after it is formed in the reticle;

FIG. 3C illustrates a pattern formed in the photoresist of a silicon wafer using the reticle of FIG. 3B;

FIG. 4A illustrates an ideal pattern to be placed on a substrate;

FIG. 4B illustrates two basic stencil shapes;

FIG. 4C illustrates the two basic stencil shapes shown in FIG. 4B in an overlapping manner;

FIG. 4D illustrates a pattern formed on a reticle by use of the overlapping stencil shapes shown in FIG. 4C;

FIG. 4E illustrates a pattern formed on a substrate by use of the pattern shown in FIG. 4D;

FIG. 5A illustrates two basic stencil shapes in an overlapping manner where one of the stencil shapes consists of two disjointed squares;

FIG. 5B illustrates a pattern formed on a reticle by use of the overlapping stencil shapes shown in FIG. 5A;

FIG. 5C illustrates a pattern formed on a substrate by use of the pattern shown in FIG. 5B;

FIG. 6A illustrates a stencil shape for forming a pattern on a reticle;

FIG. 6B illustrates a pattern formed on a reticle by use of the stencil shape shown in FIG. 6A;

FIG. 6C illustrates a pattern formed on a substrate by use of the pattern shown in FIG. 6B;

FIG. 7A illustrates four stencil shapes used to form a pattern on a surface;

FIG. 7B illustrates a pattern formed on a surface by use of the stencil shapes shown in FIG. 7A;

FIG. 8A illustrates a set of characters formed on a stencil mask;

FIG. 8B illustrates a pattern formed on a surface by use of the set of characters shown in FIG. 8A;

FIG. 8C illustrates a set of adjustment characters;

FIG. 19 illustrates examples of glyphs; and

FIG. 20 illustrates examples of parameterized glyphs.

DETAILED DESCRIPTION OF THE EMBODIMENTS

Figure 1:
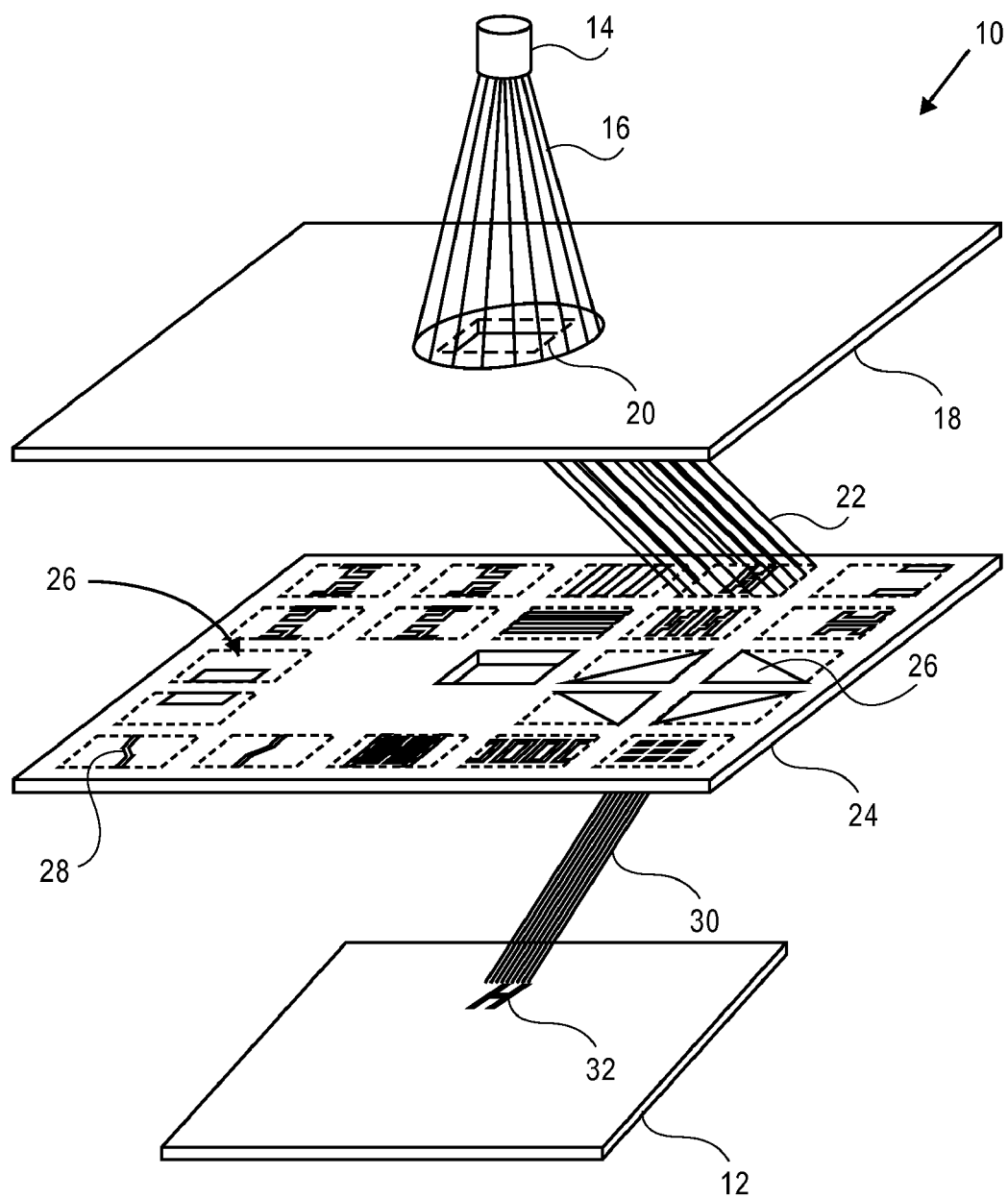
FIG. 1 is a cell projection system used to manufacture a surface.

Referring now to the drawings, wherein like numbers refer to like items, FIG. 1 number 10 identifies an embodiment of a lithography system, such as a particle beam writer system, in this case an electron beam writer system, that employs character projection to manufacture a surface 12 according to the present disclosure. The electron beam writer system 10 has an electron beam source 14 that projects an electron beam 16 toward an aperture plate 18. The plate 18 has an aperture 20 formed therein which allows the electron beam 16 to pass. Once the electron beam 16 passes through the aperture 20 it is directed or deflected by a system of lenses (not shown) as electron beam 22 toward another rectangular aperture plate or stencil mask 24. The stencil mask 24 has formed therein a number of apertures 26 that define various types of characters 28. Each character 28 formed in the stencil mask 24 may be used to form a pattern in the surface 12. An electron beam 30 emerges from one of the apertures 26 and is directed onto the surface 12 as a pattern 32. The surface 12 is coated with resist (not shown) which reacts with the electron beam 30. The pattern 32 is drawn by using one shot of the electron beam system 10. This reduces the overall writing time to complete the pattern 32 as compared to using a variable shape beam (VSB) projection system or method. The surface 12 may be a reticle. The surface 12 may then be used in another device or machine, such as a scanner, to transfer the pattern 32 onto a silicon wafer to produce an integrated circuit or a chip. More generally, the reticle 12 is used in another device or machine to transfer the pattern 32 on to a substrate.

As indicated above, since semiconductor and other nano-technology manufacturers are reaching the limits of optical lithography it is difficult to transfer an ideal pattern onto a substrate. For example, FIG. 2A illustrates an ideal pattern 40, which represents a circuit, to be formed in the resist of a substrate. When a reticle is produced that attempts to have the pattern 40 formed thereon, the reticle is not a perfect representation of the pattern 40. A pattern 42 that may be formed in a reticle that attempts to represent the pattern 40 is shown in FIG. 2B. The pattern 42 has more rounded and shortened features as compared to the pattern 40. When the pattern 42 is employed in the optical lithography process a pattern 44 is formed in the photoresist on the substrate as depicted in FIG. 2C. The pattern 44 is not very close to the ideal pattern 40, demonstrating why optical proximity correction is required.

In an effort to compensate for the difference in the patterns 40 and 44 optical proximity correction is used. Optical proximity correction alters the reticle to compensate for distortions created by optical diffraction, optical interactions with neighboring shapes, and resist process effects. FIGS. 3A-3C show how optical proximity correction can be employed to enhance the optical lithography process to develop a better version of the pattern 44. In particular, FIG. 3A illustrates a pattern 50 that is an altered version of the pattern 40. The pattern 50 has a serif element 52 added to various corners of the pattern 50 to provide extra area in an attempt to reduce optical and processing effects that reduce the sharpness of the corner. When a reticle of the pattern 50 is produced it may appear in the reticle as a pattern 54 as shown in FIG. 3B. When the optical proximity corrected pattern 54 is used in an optical lithography device an output pattern 56, as depicted in FIG. 3C, is produced. The pattern 56 more resembles the ideal pattern 40 than the pattern 44 and this is due to optical proximity correction. Although using optical proximity correction is helpful, it may require that every pattern be altered or decorated which increases the time and cost to produce a reticle or photomask. Also, the various patterns formed on the reticle may properly have slight differences between them when OPC is applied and this adds to the time and expense in preparing a reticle. Further, the large number of slight differences or variations in the patterns may make producing a reticle unmanageable using character projection systems because the number of required characters would be too large.

Referring now to FIG. 4A, an ideal pattern 60, such as a contact, that is to be placed on a substrate is shown. The ideal pattern 60 is in the shape of a square. In an attempt to provide a reticle that will transfer the pattern 60 onto the substrate as closely as possible the following steps are used. FIG. 4B shows two basic stencil shapes or characters 62 and 64 that can be used to write the ideal pattern 60 onto a reticle. The stencil shape 62 is a square shape 66 having a serif 68 positioned at each corner 70, 72, 74, and 76. The stencil shape 64 is an adjustment character that may be repositioned on the shape 62 to change or alter the shape of the serif 68 at one or more of the corners 70, 72, 74, and 76. For example, in FIG. 4C the stencil shape 64 is shown overlapping the corner 74 of the stencil shape 62. When the stencil shapes 62 and 64 are used in a cell projection device, such as the electron beam writer system 10 shown in FIG. 1, to write a pattern onto a reticle, a pattern 78 as shown in FIG. 4D will appear. The pattern 78 has a corner 80 that is more elongated or pronounced that any of the other corners. This is due to the use of the stencil shape 64 to alter the corner 74. The pattern 78, which is on a photomask or a reticle, may be used in a conventional lithographic device to transfer the pattern 78 onto a substrate. For example, if pattern 78 on the reticle was the appropriate shape given the neighboring shapes that affect optical proximity correction for producing as close to the pattern 60 as possible on the substrate, a pattern 82 as depicted in FIG. 4E, would be the result of the pattern 78 being transferred onto a substrate. The pattern 82 is similar to or an approximation of the ideal pattern 60.

Various other patterns may be formed with the use of the stencil shapes 62 and 64. For example, two instances of the shape 64 can be combined together as one character 90 used to overlap the corners 70 and 74 to form a pattern 92, which is shown in FIG. 5A. Stencil shapes 90 and 92 are overlapping shots that may produce pattern 94 in FIG. 5B on the reticle. When the pattern 94 on the reticle is the appropriate shape given the neighboring shapes that affect optical proximity correction for producing as close to the pattern 60 as possible on the substrate, a pattern 96 as is shown in FIG. 5C appears on the substrate when the pattern 94 on a reticle is used to project the substrate. The pattern 96 is substantially the same as the ideal pattern 60. It is also possible and contemplated to change or vary the dose that is used in the electron beam writer system 10, in order to further modify or adjust the various patterns that are formed on a reticle. As can be appreciated, with the use of a few stencil shapes a large number or diversity of shapes can be created on a surface such as a reticle.

Figure 12:
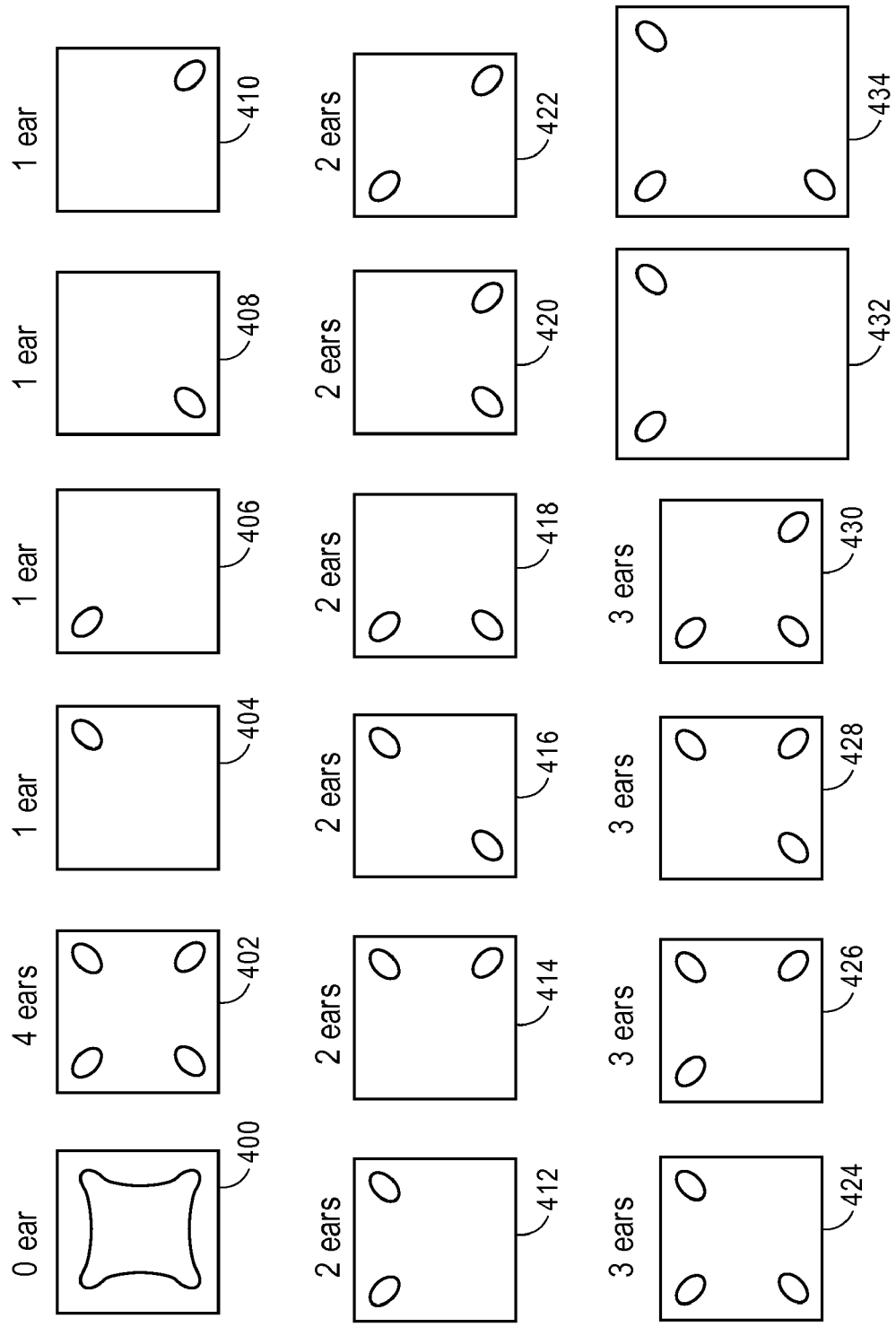
FIG. 12 illustrates a set of characters and adjustment characters with shape variation.
Figure 13:
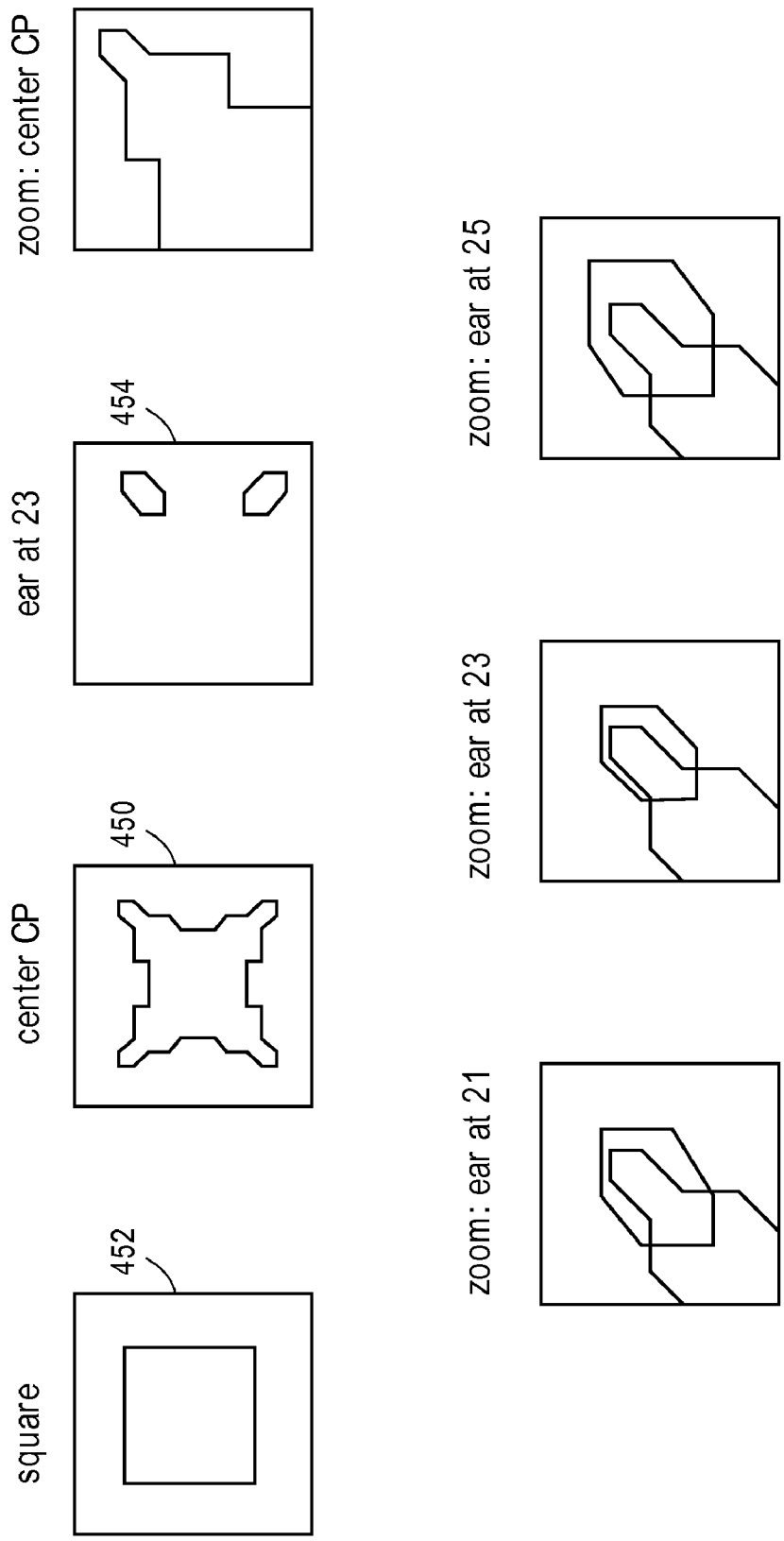
FIG. 13 illustrates a set of characters and adjustment characters with positional variation.
Figure 14:
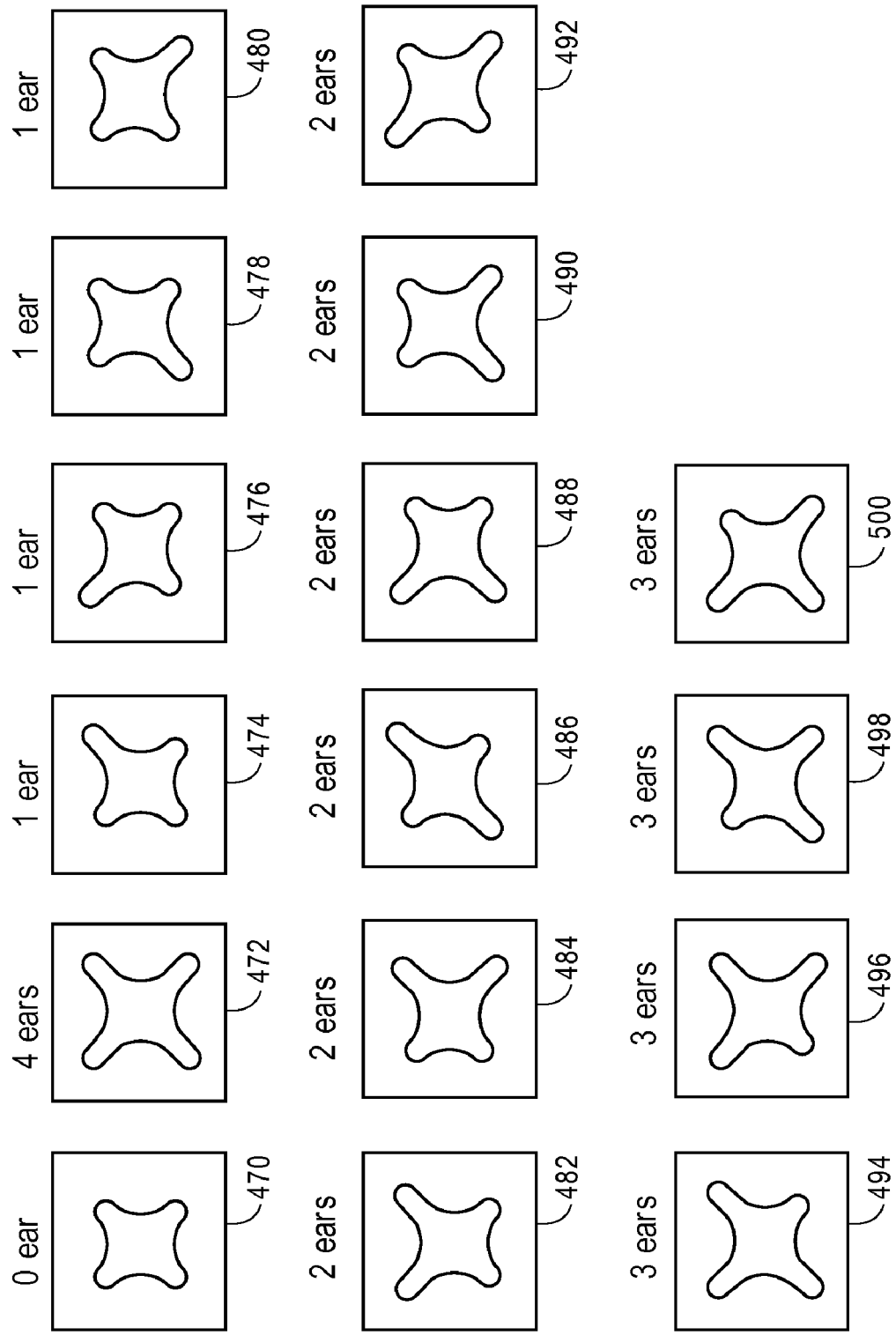
FIG. 14 illustrates a set of patterns created by shape variation of adjustment characters.

With particular reference now to FIG. 12, a set of sixteen characters, 400, 402, 404, 406, 408, 410, 412, 414, 416, 418, 420, 422, 424, 426, 428, and 430 are shown as the characters would appear on a surface after being projected by a character projection system. The "0 ear" pattern on the surface, as shown by the character 400, was projected by a character whose design is shown in FIG. 13 as "center CP" 450 to project a pattern on a design that is a square as shown in FIG. 13 as "square". 452. The "2 ears" pattern, as shown by the character 414, is projected by a character whose design is shown in FIG. 13 as "ear at 23" 454 and is an example of an adjustment character. Similarly, the fifteen characters 402, 404, 406, 408, 410, 412, 414, 416, 418, 420, 422, 424, 426, 428, and 430 projected in combination with character 400 may create fifteen patterns 472, 474, 476, 478, 480, 482, 484, 486, 488, 490, 492, 494, 496, 498, and 500, as depicted in FIG. 14 on a surface. A pattern 470 (FIG. 14) is created by projecting character 400 along with a certain dose. The fifteen patterns 472, 474, 476, 478, 480, 482, 484, 486, 488, 490, 492, 494, 496, 498, and 500 of FIG. 14 are glyphs formed by a combination of two character shots that are examples of a large variation of slightly different patterns that may be generated on the surface from a small set of characters. A potential reason for the need for the large variation is optical proximity correction for the eventual projection using optical lithography in the case where the surface is a reticle or a photomask. In order to project the square 452 as shown in FIG. 13 on the substrate, because of the need for optical proximity correction, a large variation of slightly different patterns that are variations of the "O ear" 400 (FIG. 12) need to be generated on the reticle. The present disclosure however is independent of the reason to need the large variation of slightly different patterns.

Figure 15:
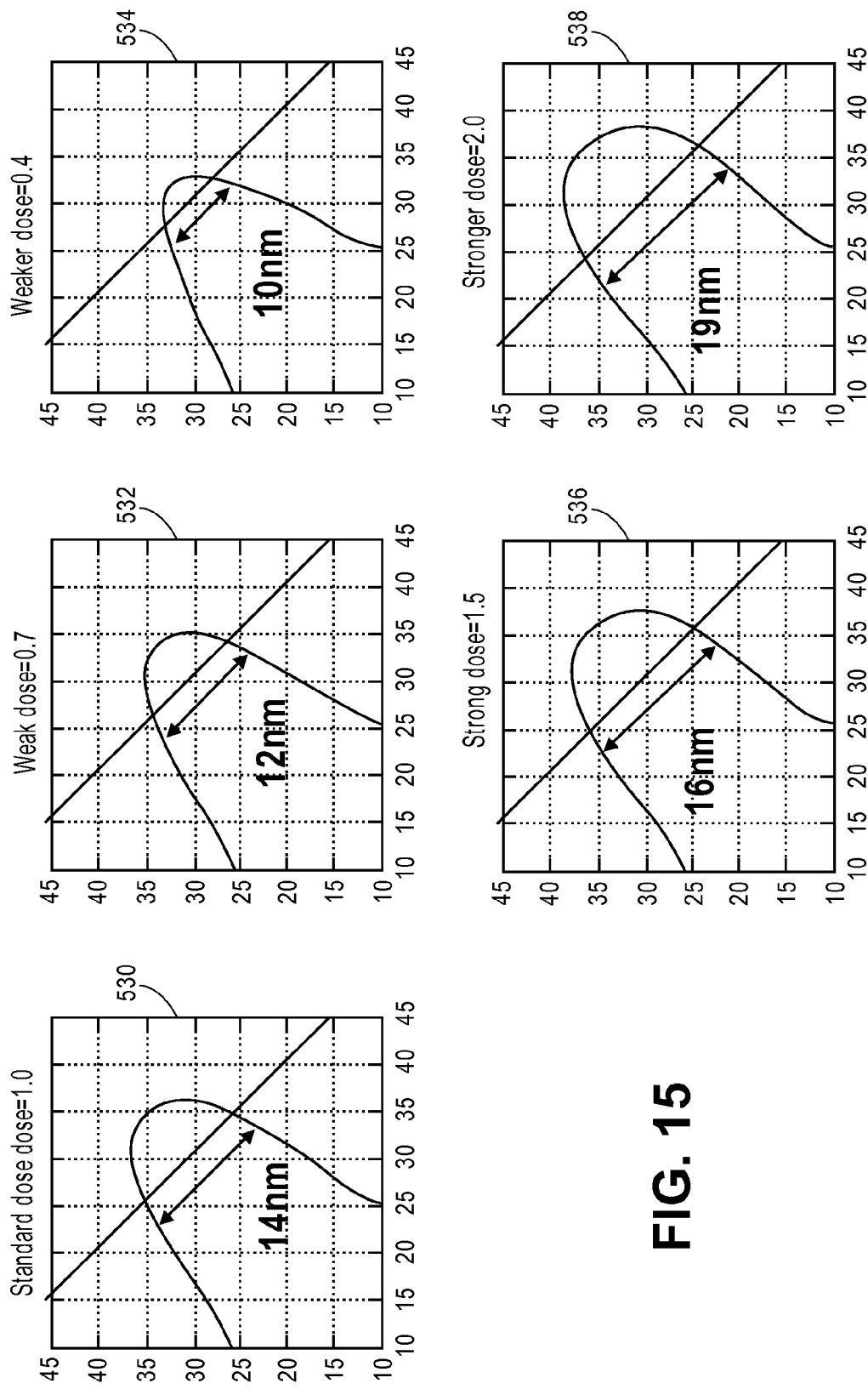
FIG. 15 illustrates a set of patterns created by various dosage amounts of adjustment characters.
Figure 16:
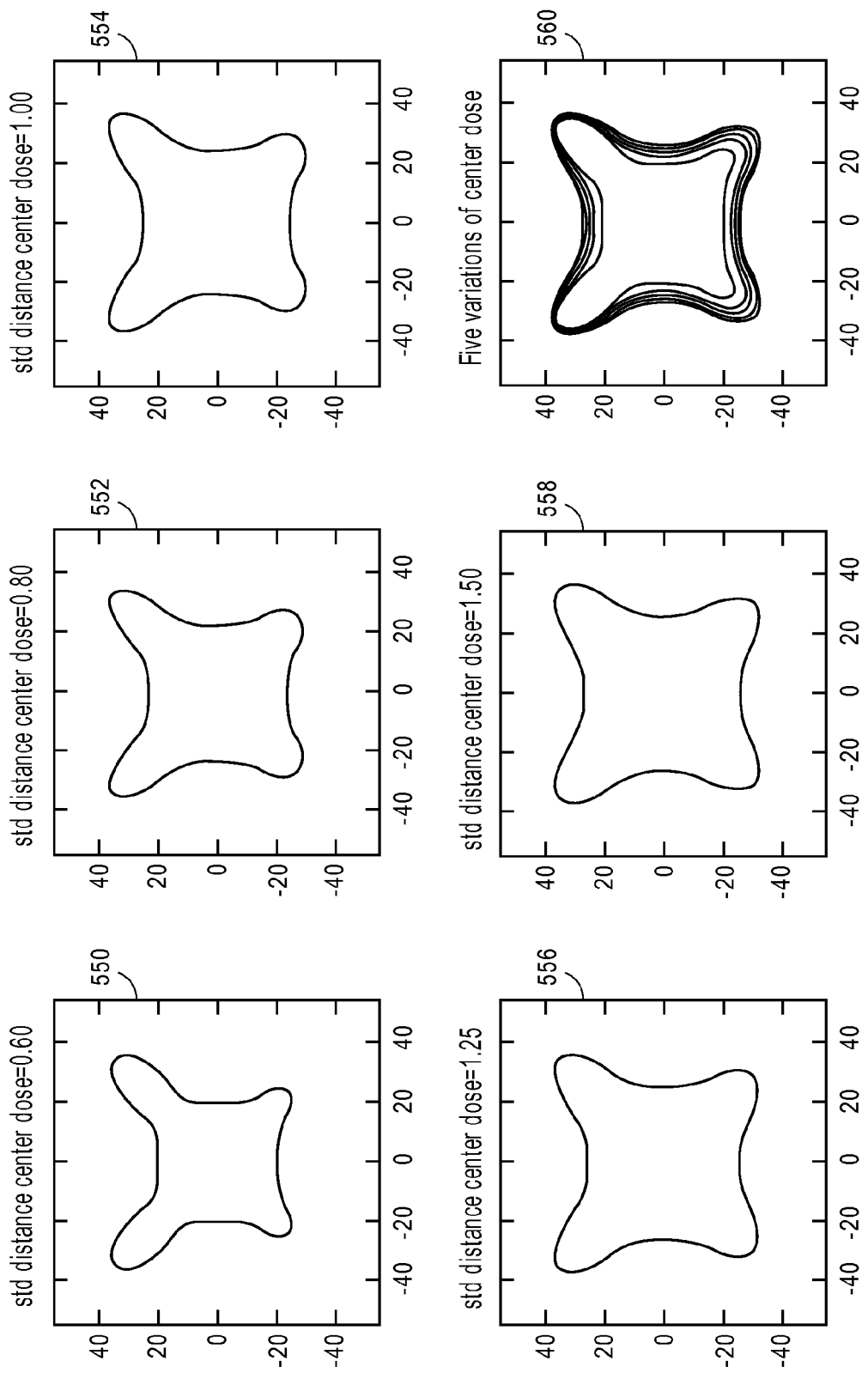
FIG. 16 illustrates a set of patterns created by various dosage amounts of a single character.
Figure 17:
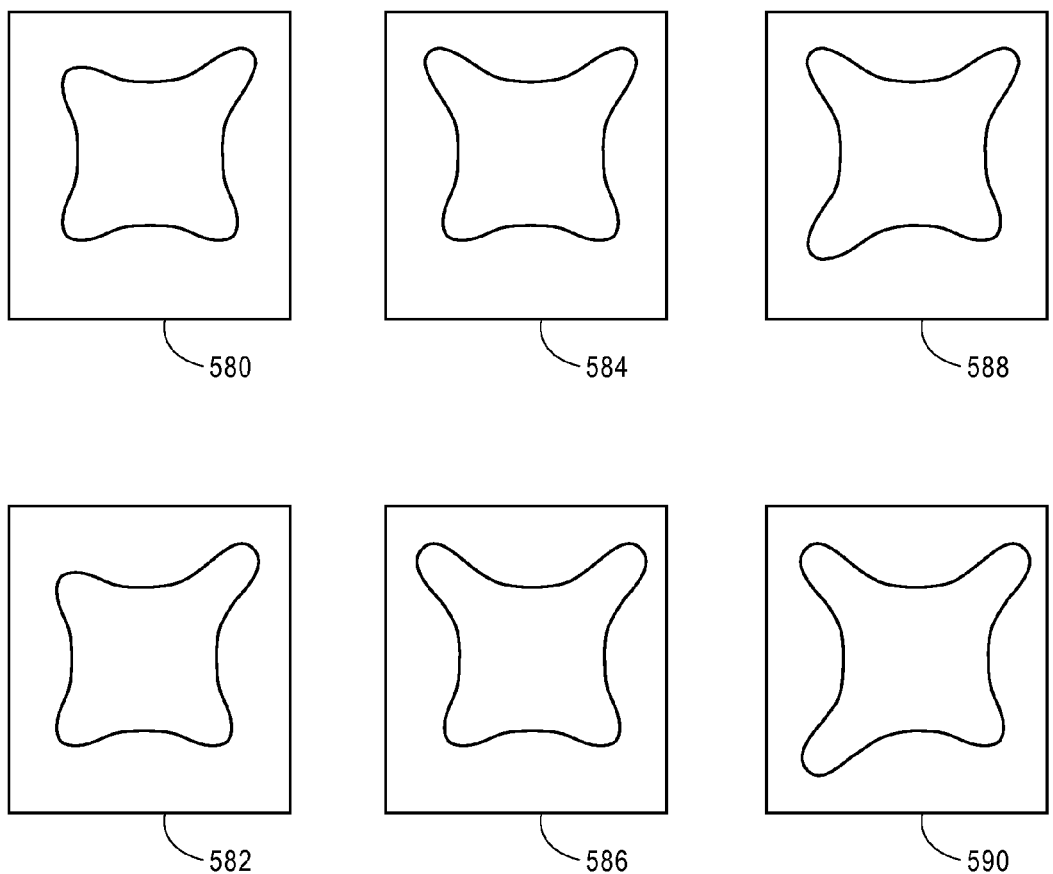
FIG. 17 illustrates a set of patterns created by positional variation of adjustment characters.

By varying the dose of the adjustment characters, the variety of patterns that can be shot on the surface through only these characters further increases. FIG. 15 represents the cases 530, 532, 534, 536, and 538 of the dose being varied by 0%, −30%, −60%, +50%, and +100% generating critical dimension variations from 10 nm to 19 nm. In addition, the dose of the center character represented by "0 ear" 400 (FIG. 12) can also be varied to create further variation of slightly different patterns. FIG. 16 represents the different shapes 550, 552, 554, 556, and 558 that can be generated on the surface by varying the dose by −40%, −20%, 0%, +25%, and +50%. A shape 560 illustrates the overlapping of the shapes 550, 552, 554, 556, and 558 to further demonstrate that slightly different patterns can be generated by varying the dose. Each of the patterns 550, 552, 554, 556, and 558 may be glyphs, or patterns that are known to be available by combining a small number of character shots. A parameterized glyph may be used as a more compact representation with more generality to describe a number of glyphs in a single description. A pattern 560 demonstrates that a dose amount may be a parameter to represent multiple glyphs with one representation. A parameterized glyph that is a single description describing all of these possible glyphs 550, 552, 554, 556, and 558 is a more compact and a more flexible representation. Slightly different patterns can also be generated by shooting the same basic patterns of the adjustment characters in different positions. Referring to FIG. 17, a pattern 580 and a pattern 582 are composed by placing the same 1 ear character, such as the character 404 shown in FIG. 12, at different locations to the 0 ear character, such as the character 400 in FIG. 12. By preparing a number of variations of the characters, in this case the variations of the center character and the variations of adjustment characters and varying the dose and relative positions, a very large number of slightly different patterns can be projected on the surface while using only two shots. With three or more shots, the number of available glyph patterns that can be projected on the surface increases geometrically. Other patterns, such as patterns 584, 586, 588, and 590 are also shown in FIG. 17. For example, the pattern 584 is formed by combining character 400 (FIG. 12) with the character for standard distance for 2 ears using an adjustment character 412 shown in FIG. 12. The pattern 586 is formed by combining character 400 with the character for a long distance for 2 ears using the adjustment character 432 of FIG. 12. The pattern 588 is formed by combining character 400 of FIG. 12 with the character for a standard distance for 3 ears using the adjustment character 424 of FIG. 12. The pattern 590 is formed by combining character 400 of FIG. 12 with the character for a long distance for 3 ears using an adjustment character 434 shown in FIG. 12.

With reference now to FIG. 6A, another stencil pattern 100 is shown that can be used in an attempt to form a pattern on a substrate, such as a silicon wafer, to resemble the ideal pattern 60 as shown in FIG. 4A. The stencil pattern 100 includes a stencil shape 102 having a serif 104 at each corner 106, 108, 110, and 112. The stencil pattern 100 also has a sub-resolution assist feature (SRAF) 114 positioned at a diagonal at each of the corners 106, 108, 110, and 112. The stencil pattern 100 is used to form a pattern 116 on a reticle, as is shown in FIG. 6B. With reference now to FIG. 6C, the pattern 116 is then used to form a pattern 118 on a substrate. The pattern 118 is similar to the ideal pattern 60.

FIG. 7A illustrates four stencil characters 150, 152, 154, and 156 that may be used on a stencil mask to be combined to form a sophisticated shape or pattern 158 on a reticle as shown in FIG. 7B. In particular, the first character 150 is shot or projected onto the reticle, then the second character 152 is shot, then the third character 154, and finally the fourth character 156. The characters are curvilinear in shape and not rectilinear in shape. In this manner, a complex pattern, such as the pattern 158, may be formed on a reticle. The shapes on the stencil mask may be termed "characters" and the pattern formed on the reticle may be termed a "glyph". It is also possible to use dose control in addition to shape variation to generate more slight variations of patterns formed on a reticle by using the same stencil characters, such as the characters 150, 152, 154, and 156. A combination of multiple characters may be overlapped with each other with different dose variations to increase the variation of possible shapes or patterns that may be generated. Additionally, the position of a character may be changed to increase the variation of possible shapes or patterns that may be generated. Since the shapes of the characters 150, 152, 154, and 156 are curvilinear this reduces the number of shots that must be used by a particle beam writer system to shoot or project the characters 150, 152, 154, and 156 onto a reticle to write a glyph pattern, such as the pattern 158. For example, the pattern 158 can be shot by using only the four characters 150, 152, 154, and 156. While if rectilinear shapes were used many more shots or VSB shots would have to be used. As can be seen, being able to use characters instead of VSB shots reduces the time in preparing a reticle. It is also possible to use rectilinear shapes with curvilinear shapes to form a pattern on a reticle. While this feature of character projection is available in character projection systems for projecting surfaces that require a very large variety of shapes, the number of characters that can be made available as single components are not large enough.

The present method and system combines multiple characters with dose, position, or partial projection variations with potentially overlapping shots to increase the number of glyph patterns available dramatically. By having a large number of glyphs as available patterns instead of the very limited number of characters as available patterns, more complex patterns can be projected on the surface without significantly affecting the shot count or write times. Alternatively, using the large number of thus available glyphs allows surfaces with highly complex shapes to be shot with far less number of shots and write times.

Figure 8D:
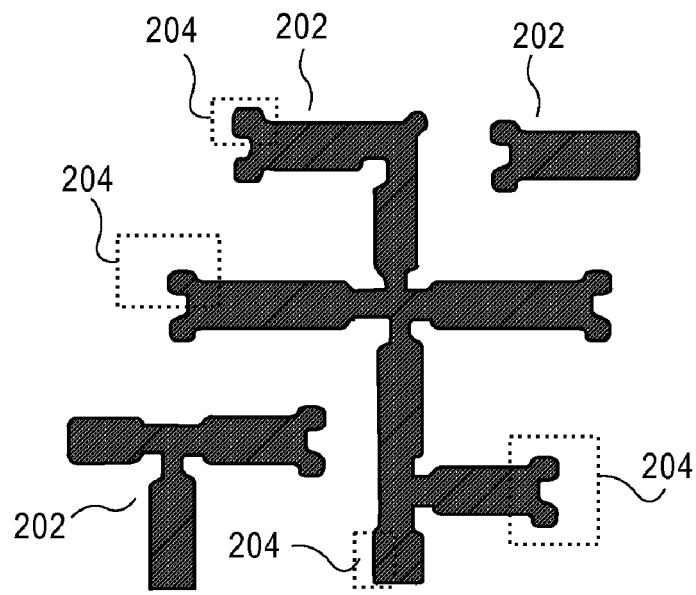
FIG. 8D illustrates, using solid and dotted line shapes, the varying degrees of doses by which each character and adjustment characters are exposed in the resist of a surface by use of the set of characters shown in FIG. 8A and the adjustment characters shown in FIG. 8C.
Figure 8E:
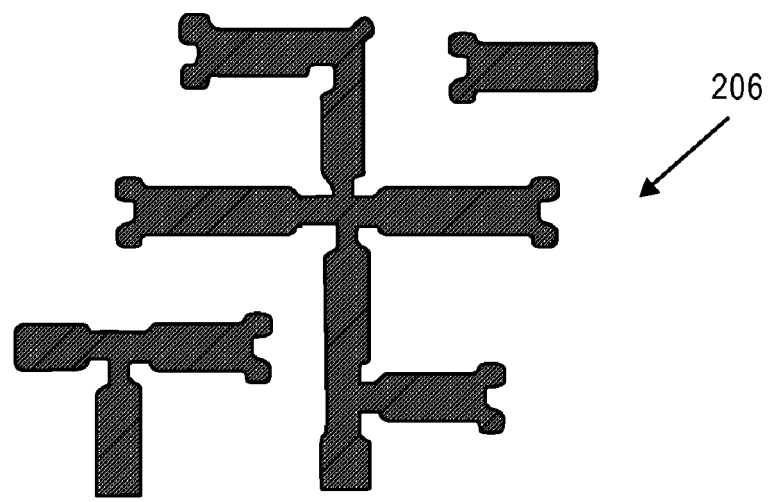
FIG. 8E illustrates a pattern formed in a surface by use of the set of characters shown in FIG. 8A and the adjustment characters shown in FIG. 8C.

Referring now to FIG. 8A, an example of a set of characters 200 that may be placed on a stencil mask is shown. The set of characters 200 may be used to form a pattern 202 on a reticle, as is illustrated in FIG. 8B. The pattern 202 may be formed from one or more of the characters in the set of characters 200. However, in an effort to better form an ideal pattern to be transferred on a silicon wafer by use of a reticle, adjustment characters or shots 204, as seen in FIG. 8C, may be used to further enhance the pattern 202. FIG. 8D depicts an example of the pattern 202 in combination with the adjustment characters 204 that may be formed in the resist of a reticle. The adjustment characters 204 are shown in dotted lines to indicate a smaller dose for these characters 204 as compared to the dose used to shoot the other characters 202. FIG. 8E shows a pattern 206 that is formed in a reticle by use of the set of characters 200 and the adjustment characters 204 with varying doses. A limited number of characters, such as the set of characters 200, may be used to form a plurality of different shaped patterns or a plurality of slightly different shaped patterns.

Figure 9:
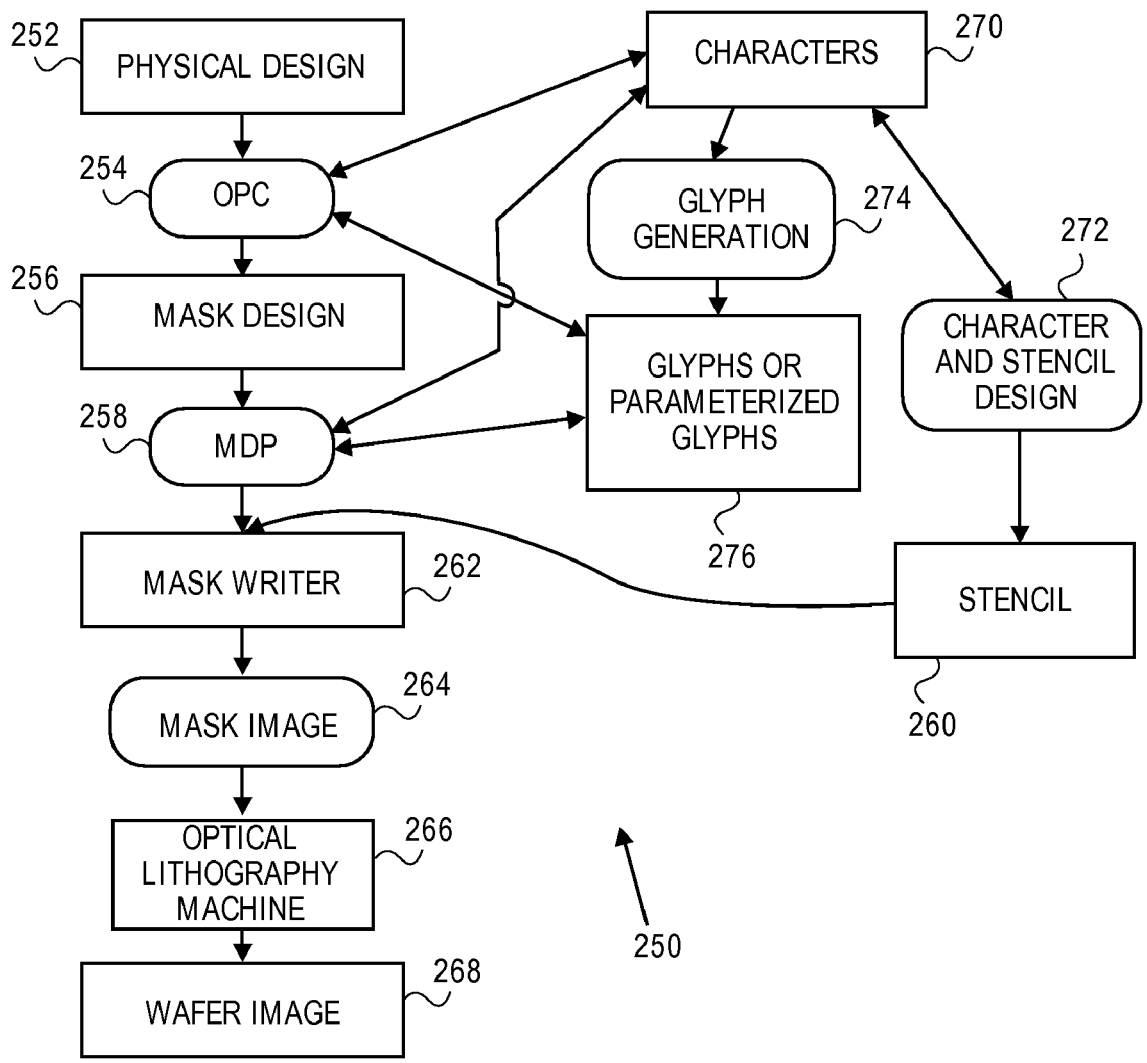
FIG. 9 illustrates a conceptual flow diagram of how to prepare a surface for use in fabricating a substrate such as an integrated circuit on a silicon wafer.

FIG. 9 is a conceptual flow diagram 250 of how to prepare a reticle for use in fabricating a surface such as an integrated circuit on a silicon wafer. In a first step 252, a physical design, such as a physical design of an integrated circuit is designed. This can include determining the logic gates, transistors, metal layers, and other items that are required to be found in a physical design such as that in an integrated circuit. Next, in a step 254, optical proximity correction is determined. In an embodiment of this disclosure this can include taking as input a library of pre-calculated glyphs or parameterized glyphs. This can also alternatively, or in addition, include taking as input a library of pre-designed characters including complex characters that are to be available on a stencil 260 in a step 262. In an embodiment of this disclosure, an OPC step 254 may also include simultaneous optimization of shot count or write times, and may also include a fracturing operation, a shot placement operation, a dose assignment operation, or may also include a shot sequence optimization operation, or other mask data preparation operations. Once optical proximity correction is completed a mask design is developed in a step 256. Then, in a step 258, a mask data preparation operation which may include a fracturing operation, a shot placement operation, a dose assignment operation, or a shot sequence optimization may take place. Either of the steps of the OPC step 254 or of the MDP step 258, or a separate program independent of these two steps 254 or 258 can include a program for determining a limited number of stencil characters that need to be present on a stencil or a large number of glyphs or parameterized glyphs that can be shot on the surface with a small number of shots by combining characters that need to be present on a stencil with varying dose, position, and degree of partial exposure to write all or a large part of the required patterns on a reticle. It is to be understood throughout this disclosure that the mask data preparation step 258 or mask data preparation does not include OPC. Combining OPC and any or all of the various operations of mask data preparation in one step is contemplated in this disclosure. Mask data preparation step 258 which may include a fracturing operation may also comprise a pattern matching operation to match glyphs to create a mask that matches closely to the mask design. Mask data preparation may also comprise inputting patterns to be formed on a surface with the patterns being slightly different, selecting a set of characters to be used to form the number of patterns, the set of characters fitting on a stencil mask, and the set of characters based on varying character dose or varying character position or applying partial exposure of a character within the set of characters to reduce the shot count or total write time. A set of slightly different patterns on the surface may be designed to produce substantially the same pattern on a substrate. Also, the set of characters may be selected from a predetermined set of characters. In one embodiment of this disclosure, a set of characters available on a stencil in a step 270 that may be selected quickly during the mask writing step 262 may be prepared for a specific mask design. In that embodiment, once the mask data preparation step 258 is completed, a stencil is prepared in a step 260. In another embodiment of this disclosure, a stencil is prepared in the step 260 prior to or simultaneous with the MDP step 258 and may be independent of the particular mask design. In this embodiment, the characters available in the step 270 and the stencil layout are designed in step 272 to output generically for many potential mask designs 256 to incorporate slightly different patterns that are likely to be output by a particular OPC program 254 or a particular MDP program 258 or particular types of designs that characterizes the physical design 252 such as memories, flash memories, system on chip designs, or particular process technology being designed to in physical design 252, or a particular cell library used in physical design 252, or any other common characteristics that may form different sets of slightly different patterns in mask design 256. The stencil can include a set of characters, such as a limited number of characters that was determined in the step 258, including a set of adjustment characters. Once the stencil is completed the stencil is used to generate a surface in a mask writer machine, such as an electron beam writer system. This particular step is identified as a step 262. The electron beam writer system projects a beam of electrons through the stencil onto a surface to form patterns in a surface, as shown in a step 264. The completed surface may then be used in an optical lithography machine, which is shown in a step 266. Finally, in a step 268, a substrate such as a silicon wafer is produced. As has been previously described, in a step 270 characters may be provided to the OPC step 254 or the MDP step 258. The step 270 also provides characters to a character and stencil design step 272 or a glyph generation step 274. The character and stencil design step 272 provides input to the stencil step 260 and to the characters step 270. The glyph generation step 274 provides information to a glyphs or parameterized glyphs step 276. Also, as has been discussed, the glyphs or parameterized glyphs step 276 provides information to the OPC step 254 or the MDP step 258.

Figure 10:
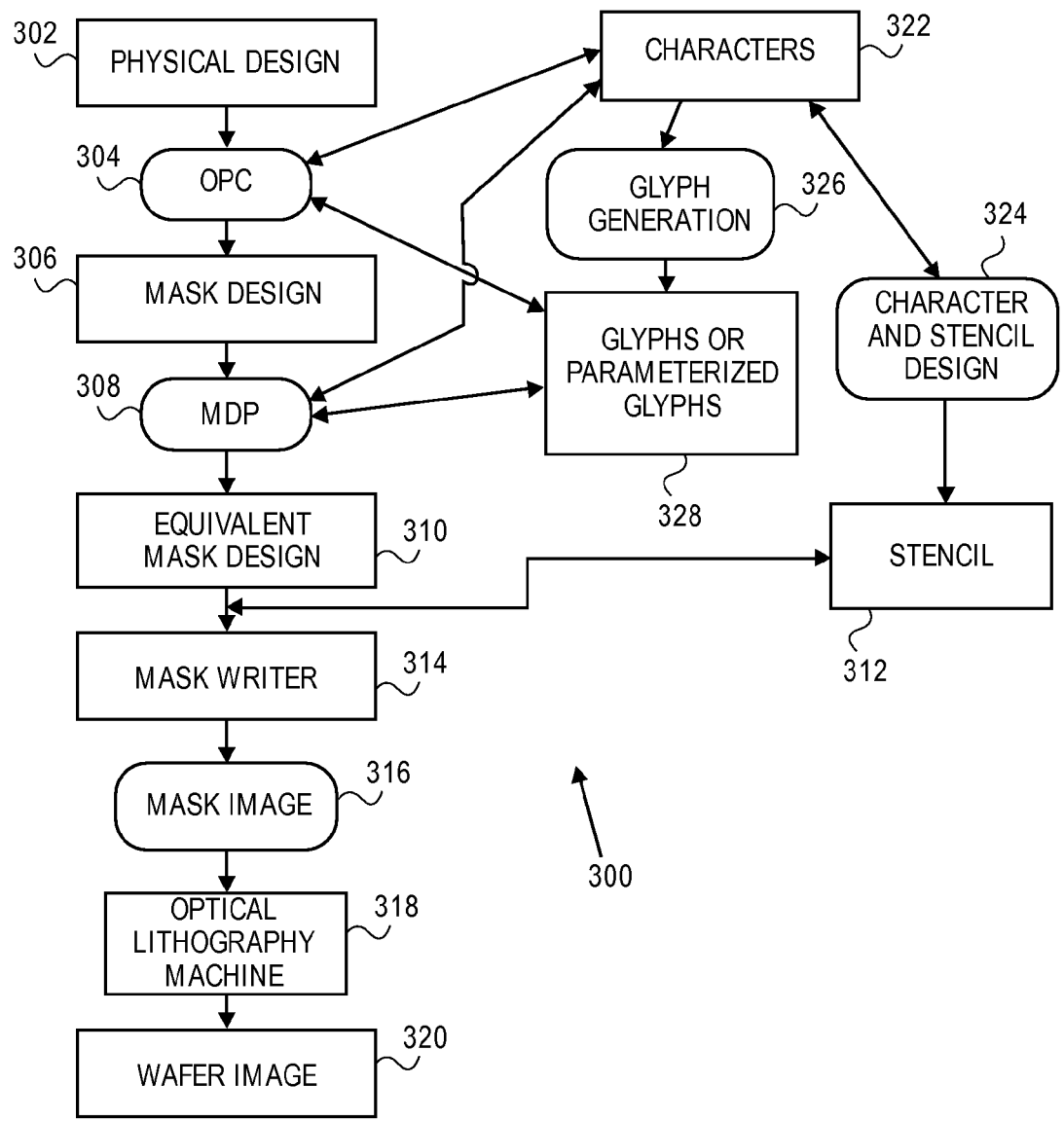
FIG. 10 illustrates another conceptual flow diagram of how to prepare a surface for use in fabricating a substrate such as an integrated circuit on a silicon wafer.

With reference now to FIG. 10, another conceptual flow diagram 300 of how to prepare a surface for use in fabricating a substrate such as an integrated circuit on a silicon wafer is shown. In a first step 302, a physical design, such as a physical design of an integrated circuit is designed. This may be the ideal pattern that the designer wants transferred onto a substrate. Next, in a step 304, optical proximity correction of the ideal pattern generated in the step 302 is determined. This can include selecting glyphs that need to be prepared. Optical proximity correction may also comprise inputting possible glyphs, the glyphs being based on predetermined characters, and the glyphs being determined using a calculation of varying a character dose or varying a character position or applying partial exposure of a character. Further, optical proximity correction may comprise selecting a glyph from the possible glyphs, computing the patterns on the substrate based on the selected glyph, and selecting another glyph if an error from the computation exceeds a predetermined threshold. The predetermined characters may be from a list of geometric patterns. Once optical proximity correction is completed a mask design is developed in a step 304. Then, in a step 306, a mask design is prepared. Once the mask design is prepared further enhancement of the mask design takes place in a mask data preparation step 308. The mask data preparation step 308 can include a program for determining a limited number of stencil characters that need to be present on a stencil to be able to write all of the required patterns on a reticle. Mask data preparation may also comprise pattern matching to match glyphs to create a mask that matches closely to the mask design. Iterations, potentially including only one iteration where a correct-by-construction "deterministic" calculation is performed, of pattern matching, dose assignment, and equivalence checking may also be performed. These steps will assist in preparing an enhanced equivalent mask design. Once the mask is enhanced an equivalent mask design is generated in a step 310. There are two motivations for tests that can be used to determine whether the equivalent mask design is really equivalent to the mask design. One motivation is to pass mask inspection. Another motivation is to confirm that the chip or integrated circuit will function properly once it has been fabricated. The closeness to which a pattern matching operation declares a match may be determined by a set of equivalence criteria. An equivalence criteria may be driven at least partially by litho-equivalence. Litho-equivalence may be determined by a set of predetermined geometric rules, a set of mathematical equations that declare a match, a partial match, or a no match, or by running a lithography simulation of the pattern on the surface design and a lithography simulation of a glyph and by comparing the two results using a set of predetermined geometric rules, or by a set of mathematical equations that declare a match, a partial match, or no match. The MDP step 308 may use a pre-determined set of available characters, glyphs, or parameterized glyphs to optimize for shot count or write time while insuring that a resulting equivalent mask design 310 is acceptable to the equivalence criteria. In another embodiment, OPC and MDP may be combined in a correct by construction method, in which case there may not be the mask design 306 generated separately from the equivalent mask design 310. The equivalent mask design may be used to prepare a stencil as is shown in a step 312. Once the stencil is completed the stencil is used to prepare a reticle in a mask writer machine, such as an electron beam writer system. This step is identified as a step 314. The electron beam writer system projects a beam of electrons through the stencil onto a surface to form patterns in a surface. The surface is completed in a step 316. The completed surface may then be used in an optical lithography machine, which is shown in a step 318 to transfer the patterns found on the surface to a substrate such as a silicon wafer to manufacture an integrated circuit. Finally, in a step 320, a substrate such as a semiconductor wafer is produced. As has been previously described, in a step 322 characters may be provided to the OPC step 304 or the MDP step 308. The step 322 also provides characters to a glyph generation step 326. The character and stencil design step 324 provides input to the stencil step 312 or to a character step 322. The character step 322 may provide input to the character and stencil design step 324. The glyph generation step 326 provides information to a glyphs or parameterized glyphs step 328. Also, as has been discussed, the glyphs or parameterized glyphs step 328 provides information to either the OPC step 308 or the MDP step 308.

Figure 18:
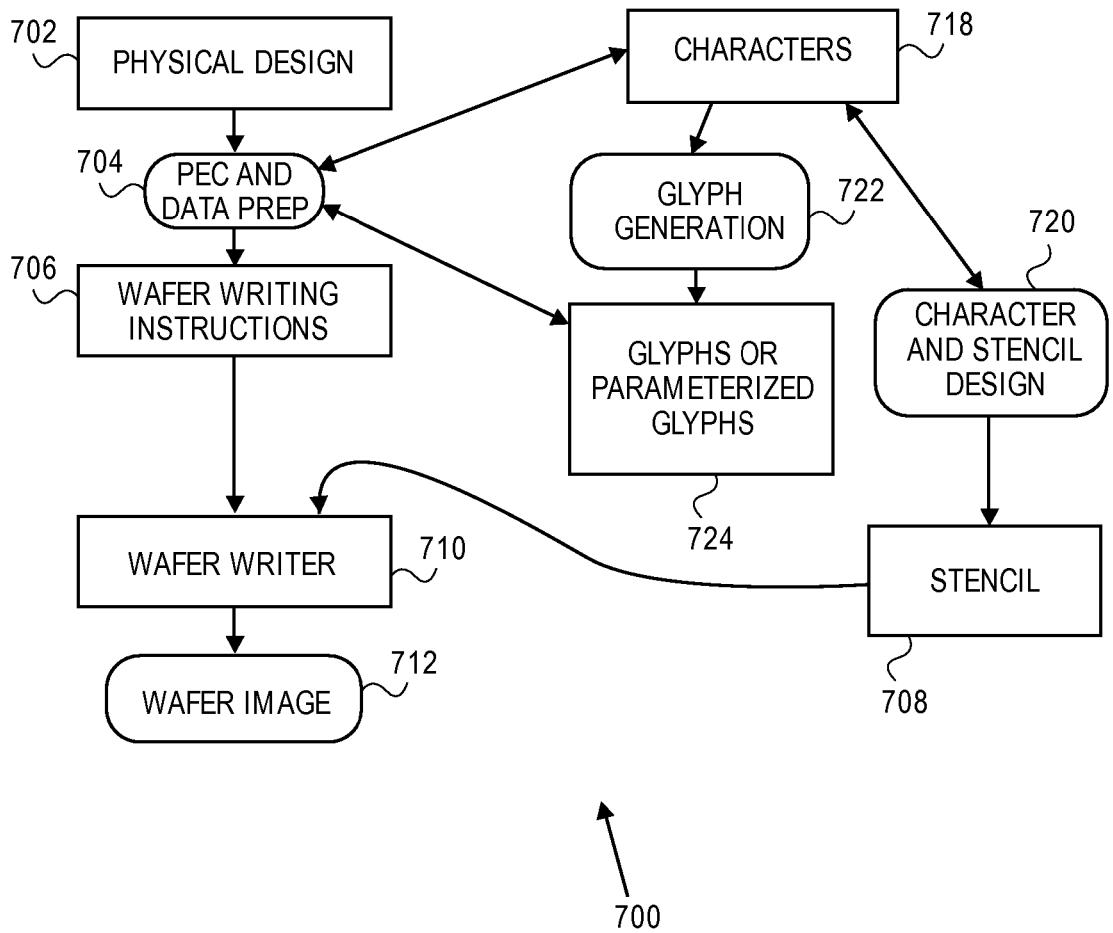
FIG. 18 illustrates a conceptual flow diagram of how to prepare a surface for use in fabricating a substrate such as an integrated circuit on a silicon wafer.

Referring now to FIG. 18, another conceptual flow diagram 700 of how to prepare a surface which is directly written on a substrate such as a silicon wafer is shown. In a first step 702, a physical design, such as a physical design of an integrated circuit is designed. This may be an ideal pattern that the designer wants transferred onto a substrate. Next, in a step 704, proximity effect correction (PEC), and other data preparation (DP) steps are performed to prepare input data to a substrate writing device, where the result of the physical design contains a multiplicity of patterns that are slightly different. The step 704 may also comprise inputting possible glyphs or parameterized glyphs from step 724, the glyphs being based on predetermined characters from step 718, and the glyphs being determined using a calculation of varying a character dose or varying a character position or applying partial exposure of a character in glyph generation step 722. The step 704 may also comprise pattern matching to match glyphs to create a wafer image that matches closely to the physical design created in the step 702. Iterations, potentially including only one iteration where a correct-by-construction "deterministic" calculation is performed, of pattern matching, dose assignment, and equivalence checking may also be performed. A stencil is prepared in a step 708 and is then provided to a wafer writer in a step 710. Once the stencil is completed the stencil is used to prepare a wafer in a wafer writer machine, such as an electron beam writer system. This step is identified as the step 710. The electron beam writer system projects a beam of electrons through the stencil onto a surface to form patterns in a surface. The surface is completed in a step 712. Further, in a step 718 characters may be provided to the PEC and Data Prep step 704. The step 718 also provides characters to a glyph generation step 722. The character and stencil design step 720 provides input to the stencil step 708 or to a character step 718. The character step 718 may provide input to the character and stencil design step 720. The glyph generation step 722 provides information to a glyphs or parameterized glyphs step 724. The glyphs or parameterized glyphs step 724 provides information to the PEC and Data Prep step 704. The step 710 may include repeated application as required for each layer of processing, potentially with some processed using the methods described in association with FIGS. 9 and 10, and others processed using the methods outlined above with respect to FIG. 18, or others produced using any other wafer writing method to produce integrated circuits on the silicon wafer.

Figure 11:
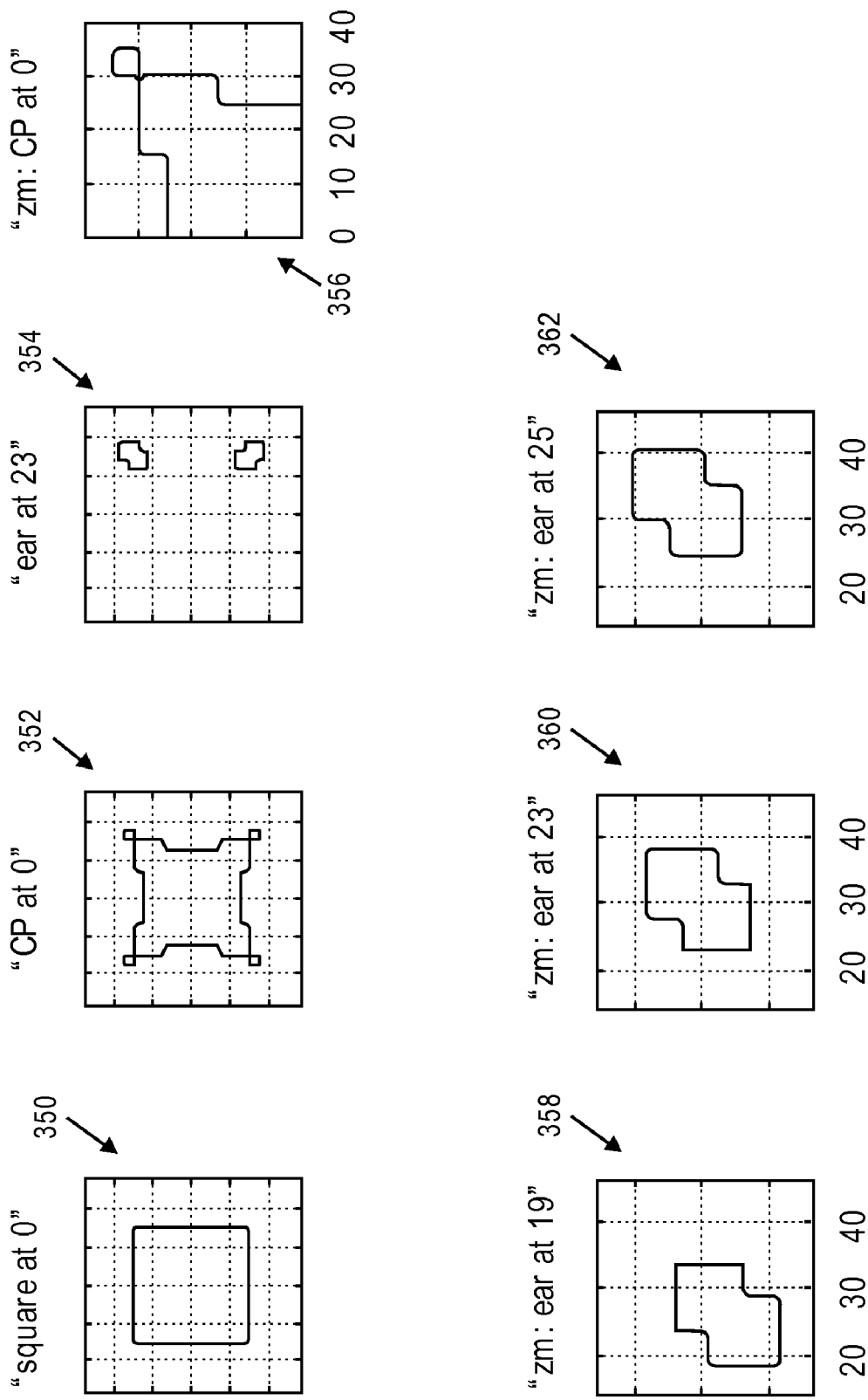
FIG. 11 illustrates a set of characters.

FIG. 11 shows various other basic template shapes or characters 350, 352, 354, 356, 358, 360, and 362 that can be used as a set of characters on a stencil to form various patterns on a reticle. The stencil characters can be modified slightly by three methods when using character projection. The first way is to modify the shape and the size of the character. For example, variable character projection may be used where a single character can be varied by partially exposing a portion of the character. The second way is to modify the dose amount slightly when shooting a given shape and size of a character. A "dose" of a particle projection shot is the shutter speed, the length of time for which a given shot is being projected on the surface of a reticle. "Dose correction" is a process step in which the dose amount for any given character projection shot is modified slightly, for example, for proximity effect correction (PEC). In this particular embodiment, in addition or in combination with other dose correction, the dose is altered purposefully to slightly modify the size and shape of the characters projected onto the surface of a reticle to form patterns or glyphs on the reticle. It is also possible to modify the patterns shot onto a reticle by using multiple overlapping shots of the characters 350, 352, 354, and 356, to produce a large variety of patterns or glyphs. The patterns or glyphs may be rectilinear, near-rectilinear, linear, or curvilinear in shape. Further, it is also contemplated to modify the dose in combination with the use of overlapping characters to generate even more varieties of patterns or glyphs. Also, a set of stencil characters may be used with VSB shots, which are an example of a simple character, to form even more patterns or glyphs on a surface. VSB shots and characters may be combined with assigned dose amounts to generate a large variety of patterns or glyphs. The third method to modify the stencil characters slightly is with positional variation. The characters 358, 360, and 362 show three variations of positions of the same character. By varying dose amounts in addition to the geometric shapes of the characters and relative position of the characters with respect to each other, the number of mask image fragments that can be quickly shot from a given collection of character projection characters is multiplied. A large number of glyphs that require a small number of characters can be made available to project complex patterns with reduced shot count and write times.

By use of a set of characters, complex shapes including connected or unconnected groups of rectilinear shapes, shapes combining edges of arbitrary angles, and shapes that include arbitrary curvatures may be formed. Arbitrary curvatures may include circles, semi-circles, and quarter-circles. A set of character projection characters are designed and are included in the stencil installed in a particle beam projection system that writes a reticle. An optical proximity correction system may be used to select a combination of character projection characters including potentially VSB shots with potential varying dose amounts and degrees of partial projection to generate a large number of patterns. A set of characters can be predesigned either specifically for a particular design or more generally for a set of designs and potential future designs with certain commonalties such as a particular semiconductor fabrication technology node. The optical proximity correction system may fracture overlapping characters each with variable dose amounts. This allows for complex shapes to be created on the reticle.

It is also possible that the optical proximity correction system can start with a large library of pre-computed or pre-calculated glyphs. The optical proximity correction system can then attempt to use the available glyphs as much as possible in performing optical proximity correction transformation of the original physical design of the integrated circuit to the reticle design. Glyphs may be each marked with an associated shot count and write time optimization value or values and an optical proximity correction system, a mask data preparation system, or some independent program may optimize for shot count or write time by selecting the lower shot count or write time. This optimization may be performed in a greedy manner where each glyph is chosen to optimize what is the best glyph to choose for shot count or write time with a certain order in which to choose glyphs to match a pattern, or in an iterative optimization manner such as with simulated annealing where exchanges of glyph selection optimizes the overall shot count or write time. It is possible that some desired patterns to be formed on a reticle may still remain unmatched by any available glyphs and such patterns may need to be formed by use of VSB shots.

Referring now to FIG. 19, examples of glyphs 1000, 1002, 1004, and 1006 that may be used by optical proximity correction, fracturing, proximity effect correction, or any other steps of mask data preparation are shown. These glyphs 1000, 1002, 1004, and 1006 may or may not be generated by a combination of the same characters or they may also be glyphs generated from four different characters. Regardless of the method of creating the glyphs, the glyphs represent possible patterns that are known to be possible patterns on the surface that can be generated with a small number of shots or write times. Each glyph may have associated with it the specification for characters required to generate the glyph, the partial exposure instructions for each of the characters, projected required dose of each character, and relative positions of the characters.

FIG. 20 shows examples of parameterized glyphs 1010 and 1012. The glyph 1010 demonstrates a general shape described with a specification of a dimension that can be varied, in this case the length X being varied from length unit values between 10 and 25. The glyph 1012 demonstrates the same general shape in a more restrictive way where the length X can only be one of the specific values, for example, 10, 15, 20, or 25. The parameterized glyph 1010 demonstrates that these descriptions allow for a large variety of possible glyphs that is not practical with the enumeration method of glyphs that are not parameterized.

An example of a parameterized glyph description for the glyph 1010 may be as follows:

```
pglyph upsideDownLShape (x : nanometers where ((x = 10) or_((x > 10)
and (x<25)) or (x = 25)));
rect (0, 0, 5, 15);
rect (0, 15, x, 20);
end pglyph;
```

An example of a parameterized glyph description for the glyph 1012 may be as follows:

```
pglyph upsideDownLShape2 (x : nanometers where ((x = 10) or_(x = 15)
or (x = 20) or (x = 25)));
rect (0, 0, 5, 15);
rect (0, 15, x, 20);
end pglyph;
```

These example descriptions are based on parameters that yield a logical test that determines which values of parameters meet a certain criteria such as "where ((x=10) or (x=15) or (x=20) or (x=25))" or "where ((x=10) or ((x>10) and (x<25)) or (x=25))." There are many other ways to describe a parameterized glyph. Another example that demonstrates a constructive method is as follows:

```
        pglyph upsideDownLShape2 (x : nanometers);
        glyphFor (x = 10, x + x+5; x>25)
        {
        rect (0, 0, 5, 15);
        rect (0, 15, x, 20);
        }
        end pglyph;.
```

While the specification has been described in detail with respect to specific embodiments, it will be appreciated that those skilled in the art, upon attaining an understanding of the foregoing, may readily conceive of alterations to, variations of, and equivalents to these embodiments. These and other modifications and variations to the present system and method for manufacturing a reticle using character projection lithography may be practiced by those of ordinary skill in the art, without departing from the spirit and scope of the present subject matter, which is more particularly set forth in the appended claims. Furthermore, those of ordinary skill in the art will appreciate that the foregoing description is by way of example only, and is not intended to be limiting. Thus, it is intended that the present subject matter covers such modifications and variations as come within the scope of the appended claims and their equivalents.

What is claimed is:

1. A method for manufacturing a surface, the method comprising the steps of:
   forming a multiplicity of slightly different patterns on the surface using a set of shots of one or more characters on a stencil mask; and
   reducing the shot count or total write time by use of a character varying technique,
   wherein the character varying technique comprises at least one of the group consisting of 1) varying a length of time that a character shot in the set of shots is projected on the surface; 2) varying an overlap of a plurality of character shots in the set of shots, the plurality of character shots including at least one shot of a non-simple character; 3) applying partial exposure of a non-simple character on the stencil mask; and 4) varying the position of a character shot in the set of shots with respect to another character shot in the set of shots to form a pattern in the multiplicity of slightly different patterns on the surface, wherein the pattern is curvilinear.

2. The method of claim 1, wherein the surface is a reticle.

3. The method of claim 2, wherein slightly different patterns on the surface produce patterns on a substrate which are substantially the same.

4. The method of claim 3 wherein an equivalence criterion determines whether the patterns on the substrate are substantially the same.

5. The method of claim 4 wherein the equivalence criterion is based on lithography simulation.

6. The method of claim 1, wherein the surface is a substrate.

7. The method of claim 1 further comprising the step of using character projection lithography.

8. The method of claim 1 further comprising the steps of:
   designing a number of patterns to be formed on a surface, the patterns being slightly different;
   designing a set of characters to be used from the number of patterns; and
   preparing a stencil mask having the set of characters.

9. A system for manufacturing a surface, the surface having a multiplicity of slightly different patterns, the system comprising:
   a stencil mask having a set of characters for forming the patterns on the surface using a set of shots of one or more characters on the stencil mask; and
   a device for reducing shot count or total write time by use of a character varying technique,
   wherein the character varying technique comprises at least one of the group consisting of 1) varying a length of time that a character shot in the set of shots is projected on the surface; 2) varying an overlap of a plurality of character shots in the set of shots, the plurality of character shots including at least one shot of a non-simple character; 3) applying partial exposure of a non-simple character on the stencil mask; and 4) varying the position of a character shot in the set of shots with respect to another character shot in the set of shots to form a pattern in the multiplicity of slightly different patterns on the surface, wherein the pattern is curvilinear.

10. A method for producing a surface, the method comprising the steps of:

designing a number of patterns to be formed on a surface, the patterns being slightly different;

designing a set of characters to be used from the number of patterns;

preparing a stencil mask having the set of characters, the stencil mask to be used to form the number of patterns using a set of shots of one or more of the set of characters; and reducing shot count or total write time by use of a character varying technique, wherein the character varying technique comprises at least one of the group consisting of 1) varying a length of time that a character shot in the set of shots is projected on the surface; 2) varying an overlap of a plurality of character shots in the set of shots, the plurality of character shots including at least one shot of a non-simple character; 3) applying partial exposure of a non-simple character on the stencil mask; and 4) varying the position of a character shot in the set of shots with respect to another character shot in the set of shots to form a pattern in the number of slightly different patterns on the surface, wherein the pattern is curvilinear.

11. The method of claim 10, wherein slightly different patterns on the surface produce patterns on a substrate which are substantially the same.

12. The method of claim 11 wherein an equivalence criterion determines whether the patterns on the substrate are substantially the same.

13. The method of claim 12 wherein the equivalence criteria is based on lithography simulation.

14. The method of claim 10, wherein the surface is a reticle.

15. The method of claim 10, wherein the surface is a substrate.

16. The method of claim 10 further comprising the step of using character projection lithography.

* * * * *